(12) United States Patent
Balbinot et al.

(10) Patent No.: US 9,132,621 B2
(45) Date of Patent: *Sep. 15, 2015

(54) NEGATIVE-WORKING LITHOGRAPHIC PRINTING PLATE PRECURSORS WITH IR DYES

(71) Applicant: Eastman Kodak Company, Rochester, NY (US)

(72) Inventors: Domenico Balbinot, Osterode (DE); Harald Baumann, Osterode (DE); Udo Dwars, Herzberg (DE); Mathias Jarek, Bad Gandersheim (DE); James Russell Matz, Fairport, NY (US); Christopher D. Simpson, Osterode (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/057,291

(22) Filed: Oct. 18, 2013

(65) Prior Publication Data

US 2014/0045118 A1 Feb. 13, 2014

Related U.S. Application Data

(63) Continuation of application No. 13/239,442, filed on Sep. 22, 2011, now Pat. No. 8,632,941.

(51) Int. Cl.
| | | |
|---|---|---|
| *G03F 7/00* | (2006.01) | |
| *B41C 1/10* | (2006.01) | |
| *G03F 7/027* | (2006.01) | |
| *G03F 7/029* | (2006.01) | |
| *G03F 7/031* | (2006.01) | |
| *G03F 7/033* | (2006.01) | |
| *G03F 7/30* | (2006.01) | |
| *G03F 7/004* | (2006.01) | |

(52) U.S. Cl.
CPC . *B41C 1/10* (2013.01); *G03F 7/004* (2013.01); *G03F 7/027* (2013.01); *G03F 7/029* (2013.01); *G03F 7/031* (2013.01); *G03F 7/033* (2013.01); *G03F 7/3035* (2013.01)

(58) Field of Classification Search
CPC ...... B41C 2210/04; G03F 7/004; B41N 3/036

USPC ................................................ 430/270.1, 302
See application file for complete search history.

(56) References Cited

U.S. PATENT DOCUMENTS

| | | |
|---|---|---|
| 6,623,910 B2 | 9/2003 | Shimada et al. |
| 6,645,697 B2 | 11/2003 | Urano |
| 6,797,449 B2 | 9/2004 | Nakamura et al. |
| 6,916,595 B2 | 7/2005 | Fujimaki et al. |
| 7,135,271 B2 | 11/2006 | Kawauchi et al. |
| 7,314,699 B2 | 1/2008 | Gries |
| 7,429,445 B1 | 9/2008 | Munnelly et al. |
| 7,524,614 B2 | 4/2009 | Tao et al. |
| 7,560,221 B2 | 7/2009 | Timpe et al. |
| 7,781,143 B2 | 8/2010 | Yu et al. |
| 2003/0198890 A1 | 10/2003 | Abe et al. |
| 2003/0215744 A1 | 11/2003 | Gries |
| 2004/0197701 A1 | 10/2004 | Mitsumoto et al. |
| 2004/0252285 A1 | 12/2004 | Lang et al. |
| 2007/0056457 A1 | 3/2007 | Iwai et al. |
| 2007/0059637 A1 | 3/2007 | Namba et al. |
| 2010/0248097 A1 | 9/2010 | Jarek et al. |
| 2011/0045408 A1 | 2/2011 | Suzuki et al. |
| 2013/0078575 A1 | 3/2013 | Balbinot et al. |

FOREIGN PATENT DOCUMENTS

| | | | |
|---|---|---|---|
| EP | 2 343 195 A1 | | 7/2011 |
| EP | 2343195 A1 | * | 7/2011 |
| JP | 2002-023362 | | 1/2002 |
| JP | 2002-293844 | | 10/2002 |
| JP | 2006-259558 | | 9/2006 |

* cited by examiner

*Primary Examiner* — Chanceity Robinson
(74) *Attorney, Agent, or Firm* — J. Lanny Tucker

(57) ABSTRACT

A lithographic printing plate precursor comprises an imageable layer comprising a free radically polymerizable component, an initiator composition capable of generating free radicals upon exposure to imaging infrared radiation, an infrared radiation absorbing dye that is defined by Structure (I) shown in the disclosure, which dyes comprise one or more ethylenically unsaturated polymerizable groups in an organic group that is attached to the methine chain. These infrared radiation absorbing dyes exhibit a reduced tendency to crystallize in the imageable layers in the presence of tetraaryl borate counter anions and therefore provide improved shelf life.

15 Claims, No Drawings

NEGATIVE-WORKING LITHOGRAPHIC PRINTING PLATE PRECURSORS WITH IR DYES

RELATED APPLICATIONS

Reference is made to copending and commonly assigned U.S. Ser. No. 13/239,435 (filed Sep. 22, 2011 by Balbinot et al.); and Copending and commonly assigned U.S. Ser. No. 13/239,442 (filed Sep. 22, 2011 by Balbinot et al.), recently allowed.

FIELD OF THE INVENTION

This invention relates to negative-working lithographic printing plate precursors comprising unique infrared radiation absorber dyes, which lithographic printing plate precursors have high imaging speed and improved shelf-life. This invention also relates to a method for preparing lithographic printing plates.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, while the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working.

Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

"Laser direct imaging" methods (LDI) have been known that directly form an offset printing plate or printing circuit board using digital data from a computer, and provide numerous advantages over the previous processes using masking photographic films. There have been considerable developments in this field from the use of more efficient lasers, and improved imageable compositions and components thereof.

Various radiation-sensitive compositions are known for use in negative-working lithographic printing plate precursors as described for example in U.S. Pat. No. 6,309,792 (Hauck et al.), U.S. Pat. No. 6,893,797 (Munnelly et al.), U.S. Pat. No. 6,727,281 (Tao et al.), U.S. Pat. No. 6,899,994 (Huang et al.), and U.S. Pat. No. 7,429,445 (Munnelly et al.), U.S. Patent Application Publications 2002/0168494 (Nagata et al.), 2003/0118939 (West et al.), and EP Publications 1,079,276A2 (Lifka et al.) and 1,449,650A2 (Goto et al.). In addition, U.S. Pat. No. 7,429,445 (Munnelly et al.) describes on-press developable negative-working lithographic printing plate precursors that contain various infrared radiation absorbers.

Negative-working lithographic printing plate precursors often contain high amounts of free radical-producing initiator compounds to increase imaging speed (improve imaging sensitivity). Some useful initiator compounds used in this manner are iodonium compounds having tetraaryl borate counter ions (such as tetraphenyl borate counter ions) as described for example, in U.S. Pat. No. 6,645,697 (Urano) and WO 2008/150441 (Yu et al.).

However, many of the cationic cyanine dyes that are used as infrared radiation absorbers in such lithographic printing plate precursors exhibit a strong tendency to crystallize in the presence of borate anions that can be in the imaging formulations. This crystallization leads to reduced shelf life of the imageable layer composition in the lithographic printing plate precursor before the precursor is imaged. The crystallization also leads to problems during manufacturing of the imageable layer formulations.

There is a need to improve imaging speed using borate-ion containing initiator compositions in negative-working lithographic printing plate precursors without the undesirable crystallization that causes the noted problems. There is also a desired to improve imaging sensitivity (speed) while solving this problem.

SUMMARY OF THE INVENTION

This invention provides a lithographic printing plate precursor comprising a substrate and an imageable layer disposed over the substrate, the imageable layer comprising:
  a free radically polymerizable component,
  an initiator composition capable of generating free radicals upon exposure to imaging infrared radiation,
  an infrared radiation absorbing dye, and
  a polymeric binder,
  wherein the infrared radiation absorbing dye is a cyanine dye that is represented by the following Structure (I):

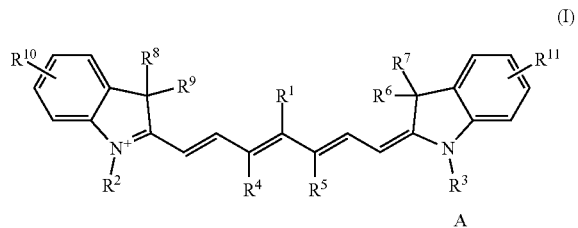

wherein:
  $R^1$ is L-$R^x$ wherein L is a single connecting bond or a sulfur or nitrogen atom and $R^x$ is an organic group that comprises a carbon atom connected to L or directly to the illustrated methine chain when L is a single connecting bond, and $R^x$ also comprises one or more ethylenically unsaturated polymerizable groups, provided that when L is a nitrogen atom, L-$R^x$ represents N($R^a$)($R^b$) wherein $R^a$ and $R^b$ are the same or different groups as defined for $R^x$,
  $R^2$ and $R^3$ each independently represent an organic group having 1 to 12 carbon atoms,
  $R^4$ and $R^5$ either both represent hydrogen atoms or, together with the carbon atoms to which they are bonded, comprise carbon atoms to form a five- or six-member carbocyclic ring, $R^6$ to $R^9$ each independently represents hydrogen, or an alkyl group or aryl group, and $R^{10}$ and $R^{11}$ independently represent hydrogen or halogen atoms, or alkyl, alkoxy, —COOR, —OR, —SR, or —NR$_2$, groups, or $R^{10}$ and $R^{11}$ independently represent sufficient carbon atoms to form a fused aromatic ring, and A represents one or more optional counter ions sufficient to provide a neutral charge for the cyanine dye.

In addition, this invention also provides a method for providing a lithographic printing plate comprising:

imagewise exposing the lithographic printing plate precursor of this invention (for example, as described above) to infrared radiation to provide exposed and non-exposed regions in the imageable layer in an imaged precursor, and processing the imaged precursor to remove the non-exposed regions.

The lithographic printing plate precursors of this invention have excellent imaging speed and the tendency of crystallization of cationic cyanine dyes in the presence of tetraaryl borate anions is considerably reduced. These advantages are achieved by using a select class of cyanine dyes as infrared radiation absorbing dyes as defined by Structure (I) above.

DETAILED DESCRIPTION OF THE INVENTION

Definitions

Unless the context indicates otherwise, when used herein, the terms "negative-working lithographic printing plate precursor", "lithographic printing plate precursor", and "precursor" are meant to be references to embodiments of the present invention.

In addition, unless the context indicates otherwise, the various components described herein such as "infrared radiation absorbing dye", "initiator", "free radically polymerizable component", "polymeric binder", and similar terms also refer to mixtures of such components. Thus, the use of the articles "a", "an", and "the" is meant to refer to a single component or multiple components.

Moreover, unless otherwise indicated, percentages refer to percents by total dry weight, for example, weight % based on total solids of either an imageable layer or radiation-sensitive composition. Unless otherwise indicated, the percentages can be the same for either the dry imageable layer or the total solids of radiation-sensitive composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

As used herein, a "stack" of lithographic printing plate precursors includes two or more of the precursors. Interleaf paper can be present between adjacent precursors, or it can be absent from the stack. Generally, a stack has at least two and more typically at least 10 and up to and including 1500 lithographic printing plate precursors, or at least 100 of them, or at least 250 and up to and including 800 of the lithographic printing plate precursors.

Substrates

The substrate used to prepare the lithographic printing plate precursors comprises a support that can be composed of any useful material. It is usually in the form of a sheet, film, or foil (or web), and is strong, stable, flexible, and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metalized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 g/m$^2$ and up to and including 5 g/m$^2$. Phosphoric acid anodization generally provides an oxide weight on the surface of at least 1 g/m$^2$ and up to and including 5 g/m$^2$. When sulfuric acid is used for anodization, higher oxide weight (at least 3 g/m$^2$) can provide longer press life.

The aluminum support can also be treated with, for example, a silicate, dextrin, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support can be treated with a phosphate solution that can further contain an inorganic fluoride (PF).

While the substrate surface over which an imageable layer is disposed is generally more hydrophilic than the imageable layer composition, the substrate can also have a subbing layer that is more hydrophobic than the substrate support, or even more hydrophobic than the imageable layer composition.

The thickness of the substrate can be varied but should be sufficient to sustain the wear from printing and thin enough to wrap around a printing form. Useful embodiments include a treated aluminum foil having a thickness of at least 100 μm and up to and including 700 μm.

Negative-Working Lithographic Printing Plate Precursors

The lithographic printing plate precursors can be formed by suitable application of a radiation-sensitive composition as described below over a suitable substrate (described above) to form an imageable layer. There is generally only a single imageable layer comprising the radiation-sensitive composition and it can be the outermost layer in the precursor and thus form part of the printing surface of the resulting lithographic printing plate precursor. However, in some embodiments, a protective outermost overcoat (topcoat, described below) can be disposed over the imageable layer.

In addition, some of the lithographic printing plate precursors are on-press developable, meaning that after imaging, they can be developed on-press during printing as described below. These precursors need not be processed or developed using off-press developing processes and equipment. Other embodiments of this invention are developed after imaging off-press before being mounted onto a printing press using a processing solution (described below). In still other embodiments, the lithographic printing plate precursors can be designed to be both on-press developable and off-press developable.

Details of negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.), all of which are incorporated herein by reference. Other negative-working compositions and elements are described for example in U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Patent Publication 2009/0092923 (Hayashi), all of which are incorporated herein by reference.

The radiation-sensitive compositions and imageable layers used in the precursors can include one or more polymeric binders that facilitate the on-press developability of the imaged precursors. Such polymeric binders include but are not limited to, those that are not generally crosslinkable and can be present at least partially as discrete particles (not-agglomerated). Such polymers can be present as discrete particles having an average particle size of at least 10 nm and up to and including 500 nm, and typically at least 100 nm and up to and including 450 nm, and that are generally distributed uniformly within that layer. The particulate polymeric binders exist at room temperature as discrete particles, for example in an aqueous dispersion. Such polymeric binders generally have a molecular weight ($M_n$) of at least 5,000 and typically at least 20,000 and up to and including 100,000, or at least 30,000 and up to and including 80,000, as determined by Gel Permeation Chromatography.

Useful particulate polymeric binders generally include polymeric emulsions or dispersions of polymers comprising hydrophobic backbones and directly or indirectly linked pendant side chains comprising alkylene oxide segments, such as poly(alkylene oxide) side chains (for example, having at least 10 alkylene segments), optionally cyano side groups, or both types of side chains, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.) and US Patent Application Publication 2005/0003285 (Hayashi et al.), all of which are incorporated herein by reference. More specifically, such polymeric binders include but are not limited to, graft copolymers having both hydrophobic and hydrophilic segments, block and graft copolymers having polyethylene oxide (PEO) segments, polymers having pendant poly(alkylene oxide) segments and optionally cyano side groups, in recurring units arranged in random fashion to form the hydrophobic polymer backbone, and various polymeric binders that can have a hydrophobic backbone and various hydrophilic side groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 and up to and including 500,000, or at least 100,000 and up to and including 300,000, as determined by dynamic light scattering.

Additional useful polymeric binders are particulate poly(urethane-acrylic) hybrids that are distributed (usually uniformly) throughout the imageable layer. Each of these hybrids has a molecular weight of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, anti-foaming agents, dispersing agents, anti-corrosive agents, and optionally pigments and water-miscible organic solvents.

The polymeric binders are generally present in an amount of at least 5 weight % and up to and including 70 weight % of the radiation-sensitive composition in the imageable layer.

Other useful polymeric binders can be homogenous, that is, non-particulate or dissolvable in the coating solvent, or they can exist as discrete particles. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.), all of which are incorporated herein by reference. Also useful are the vinyl carbazole polymers described in U.S. Pat. No. 7,175,949 (Tao et al.), and the polymers comprising a hydrophobic backbone and side chains comprising ethylenically unsaturated polymerizable groups, and optionally cyano side groups as described in U.S. Pat. No. 7,279,255 (Tao et al.), both patents being incorporated herein by reference. Useful are random copolymers derived from polyethylene glycol methacrylate/acrylonitrile/styrene monomers in random fashion and in particulate form, dissolved random copolymers derived from carboxyphenyl methacrylamide/acrylonitrile/methacrylamide/N-phenyl maleimide, random copolymers derived from polyethylene glycol methacrylate/acrylonitrile/vinyl carbazole/styrene/methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxyethyl methacrylate)/acrylonitrile/N-phenyl maleimide, and random copolymers derived from N-methoxymethyl methacrylamide/methacrylic acidlacrylonitrile/n-phenylmaleimide. By "random" copolymers, we mean the conventional use of the term, that is, the structural units in the polymer hydrophobic backbone that are derived from the monomers are arranged in random order as opposed to being block copolymers, although two or more of the same structural units can be in a chain incidentally.

Useful polymeric binders can be selected from those described below that is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Polymers having pendant allyl ester groups as described in U.S. Pat. No. 7,332,253 (Tao et al.) that is incorporated herein by reference. Such polymers can also include pendant cyano groups or have recurring units derived from a variety of other monomers as described in Col. 8, line 31 to Col. 10, line 3 of the noted patent.

III. Polymers having all carbon backbones wherein at least 40 mol % and up to and including 100 mol % (and typically at least 40 mol % and up to and including 50 mol %) of the carbon atoms forming the all carbon backbones are tertiary carbon atoms, and the remaining carbon atoms in the all carbon backbone being non-tertiary carbon atoms. Further details of such polymeric binders are provided in U.S. Patent Application Publication 2008-0280229 (Tao et al.) that is incorporated herein by reference.

IV. Polymer binders that have a hydrophobic backbone and one or more ethylenically unsaturated pendant groups or side chains (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Some of these polymers have cyano groups attached to the hydrophobic backbone. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

V. Polymeric binders can have pendant 1H-tetrazole groups as described in U.S. Patent Application Publication 2009-0142695 (Baumann et al.) that is incorporated herein by reference.

VI. Still other useful polymeric binders can be homogenous, that is, dissolved in the coating solvent, or can exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Other useful polymeric binders are particulate polyurethane-acrylic) hybrids that are distributed (usually uniformly) throughout the imageable layer. Each of these hybrids has a molecular weight of at least 50,000 and up to and including 500,000 and the particles have an average particle size of at least 10 and up to and including 10,000 nm (typically at least 30 and up to and including 500 nm).

The radiation-sensitive composition (and imageable layer) includes one or more free radically polymerizable components, each of which contains one or more free radically polymerizable groups that can be polymerized using free radical initiation. For example, such free radically polymerizable components can be one or more free radical polymerizable monomers or oligomers comprising one or more ethylenically unsaturated polymerizable groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Useful free radically polymerizable components include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds also include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other useful free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (noted above) that include 1H-tetrazole groups.

As free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

The radiation-sensitive composition in the imageable layer also includes an initiator composition that includes one or more initiators that are capable of generating free radicals sufficient to initiate polymerization of all the various free radically polymerizable components upon exposure to infrared radiation, particularly in the presence of the infrared radiation absorbing dye (described below). The combination of the infrared radiation absorbing dye and initiator composition can be responsive, for example, to electromagnetic radiation in the infrared spectral regions, for example corresponding to the spectral range of at least 700 nm and up to and including 1400 nm, and typically to radiation of at least 700 nm and up to and including 1250 nm. This spectral region can also be known as a "near-infrared" region.

More typically, the initiator composition includes one or more electron acceptors (initiators) and one or more co-initiators that are capable of donating electrons, hydrogen atoms, or a hydrocarbon radical.

In general, suitable initiator compositions for IR-radiation sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraaryl borates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Particularly useful initiator compositions include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, one useful iodonium cation includes a positively charged iodonium, (4-methylphenyl)[4-(2-methylpropyl) phenyl]-moiety and a suitable negatively charged counterion.

Thus, the iodonium cations can be supplied as part of one or more iodonium salts, for example the iodonium cations can be supplied as iodonium borates also containing suitable boron-containing anions. The iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.), including iodonium compounds comprising a diaryliodonium cation and an organic boron-containing anion, such as a tetraphenyl borate. Polyiodonium compounds with multiple boron-containing anions can also be used as described in U.S. Pat. No. 7,862,984 (Hayashi et al.).

Useful IR radiation-sensitive initiator compositions can comprise one or more diaryliodonium borate compounds such as diaryliodonium tetraaryl borates, triarylsulfonium tetraaryl borates, and alkoxy- or aryloxypyrdinium tetraaryl borates.

Useful tetraaryl borate anions can be represented by the following Structure (IBz):

wherein $R_1$, $R_2$, $R_3$, and $R_4$ are independently substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), or substituted or unsubstituted aromatic heterocyclyl groups having 5 to 10 carbon, oxygen, sulfur, and nitrogen atoms, such as substituted or unsubstituted pyridyl, pyrimidyl, furanyl, pyrrolyl, imidazolyl, triazolyl, tetrazolyl, indolyl, quinolinyl, oxadiazolyl, and benzoxazolyl groups.

For example, $R_1$, $R_2$, $R_3$, and $R_4$ are the same or different substituted or unsubstituted carbocyclic aryl groups as defined above, or in most embodiments, at least 3 of $R_1$, $R_2$, $R_3$, and $R_4$ are the same substituted or unsubstituted aryl groups (such as substituted or unsubstituted phenyl groups). In most embodiments, all of $R_1$, $R_2$, $R_3$, and $R_4$ are the same or different substituted or unsubstituted aryl groups for example, the same substituted or unsubstituted phenyl group.

Representative iodonium borate compounds useful in this invention include but are not limited to, 4-octyloxyphenyl phenyliodonium tetraphenylborate, [4[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-cyclohexylphenyl-phenyliodonium tetraphenylborate, 2-methyl-4-t-butylphenyl-4'-methylphenyliodonium tetraphenylborate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Useful compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

In general, the initiator composition is present in the imageable layer in an amount of at least 1 weight %, based on imageable layer total solids, or typically at least 2 weight % and up to and including 15 weight %, or up to and including 20 weight %.

The imageable layers comprise a radiation-sensitive imaging composition that includes one or more infrared radiation absorbing dyes. The infrared radiation absorbing dyes generally are sensitive to infrared radiation typically of at least 700 nm and up to and including 1400 nm. These compounds generally comprise an infrared radiation absorbing cyanine cation with a suitable counter ion, for example a tetraaryl borate anion (such as a tetraphenyl borate anion) as described above. The tetraaryl borate anion used in the initiator composition can be the same or different as the tetraaryl borate anion that can be used as part of the infrared radiation absorbing dye. As noted below, some cyanine dyes have both cationic and anionic charges within the chromophore and do not need to form a salt with a counterion.

In some embodiments, the molar ratio of the infrared radiation absorbing dye cation to the total tetraphenyl borate anion in the imageable layer is from 0.01:1 to and including 20:1, or typically from 0.5:1 to and including 2:1.

Useful infrared radiation absorbing dyes are represented by the following Structure (I):

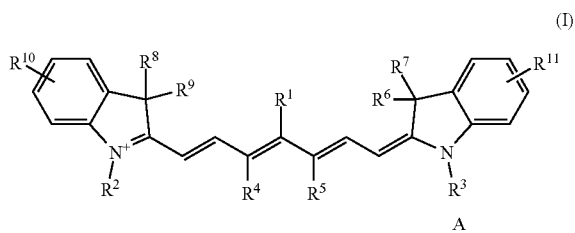

wherein $R^1$ is $L-R^x$ wherein L is a single connecting bond or a sulfur or nitrogen atom, and in most embodiments, L is a sulfur or nitrogen atom. $R^x$ is an organic group that comprises a carbon atom that is connected to L or to the methine chain when L is a single connecting bond. $R^x$ also comprises one or more one or more ethylenically unsaturated polymerizable groups. When L is a nitrogen atom, $L-R^x$ represents $N(R^a)(R^b)$ wherein $R^a$ and $R^b$ are the same or different groups as defined for $R^x$.

More particularly, $R^x$ represents a substituted or unsubstituted carbocyclic or heterocyclic aromatic group having up to 12 carbon or heteroatoms in the aromatic ring system, a substituted or unsubstituted heterocyclic non-aromatic group having up to 12 carbon and heteroatoms in the ring system, or a substituted or unsubstituted alkyl group having 1 to 12 carbon atoms. These carbocyclic or heterocyclic aromatic, heterocyclic non-aromatic group, or alkyl groups comprises one or more ethylenically unsaturated polymerizable groups.

In some embodiments, L is a single connecting bond, and $R^x$ is a group represented by the following Structure (II) wherein Y is oxygen or sulfur, and $R^y$ and $R^z$ are the same or different organic groups as defined for $R^x$, at least one of which comprises one or more ethylenically unsaturated polymerizable groups:

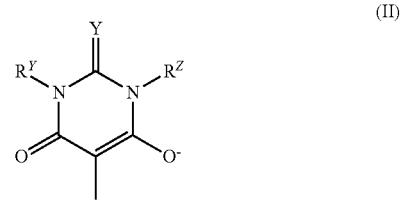

In Structure (I), $R^2$ and $R^3$ each independently represent a substituted or unsubstituted organic group having 1 to 12 carbon atoms (including substituted or unsubstituted alkyl, cycloalkyl, and alkoxy groups). Particularly useful organic groups include alkoxy groups having 1 to 12 carbon atoms, N-alkylcarboxy groups having 1 to 12 carbon atoms, and N-alkyl sulfate groups having 1 to 12 carbon atoms.

$R^4$ and $R^5$ either both represent hydrogen atoms or, together with the carbon atoms to which they are bonded, provide carbon atoms to form a five- or six-member carbocyclic ring.

Further, $R^6$, $R^7$, $R^8$, and $R^9$ each independently represent hydrogen, a substituted or unsubstituted alkyl having 1 to 12 carbon atoms, or a substituted or unsubstituted aryl group (such as substituted or unsubstituted phenyl or naphthyl groups).

$R^{10}$ and $R^{11}$ independently represent hydrogen atoms or halogen atoms, or substituted or unsubstituted alkyl groups having 1 to 12 carbon atoms, substituted or unsubstituted alkoxy groups having 1 to 12 carbon atoms, —COOR, —OR, —SR, or —$NR_2$ groups wherein R is hydrogen or an alkyl group. In addition, $R^{10}$ and $R^{11}$ can represent sufficient carbon atoms to form a fused aromatic ring.

In some embodiments, $R^x$ is a substituted or unsubstituted aliphatic, aromatic, heterocyclic, or heteroaromatic group, or a combination of two or more of such groups, and wherein $R^x$ can be linked to an aliphatic, aromatic or heteroaromatic group comprising 1 to 12 carbon atoms.

$R^1$ (or $R^x$) is an organic group that comprises one or more ethylenically unsaturated polymerizable groups (substituted or unsubstituted polymerizable —C=C— groups). This ethylenically unsaturated polymerizable group can be attached to the methine chain through a linking group that can comprise up to 15 carbon, nitrogen, oxygen, or sulfur atoms, or combinations thereof as long as an oxygen atom is not directly connected to the methine chain. Some useful linking groups are illustrated in the compounds described below, but in general, the linking group can be a combination of alkylene, arylene, thio, oxy, amino, or hetero groups with the exception described above. Useful linking groups are also described in WO 2005/071488 (Timpe et al.). Representative $R^1$ groups include 2-thio-(4-ethenyl)-benzyl-5-mercapto-1,3,4-thiadiazole, 2-thio-(4-methyl-crotonato)-5-mercapto-1,3,4-thiadiazole, 2-thio-(4-ethenyl)-benzyl-4,6-dimercapto-1,3,5-triazine, 2,4-di-thio-(4-ethenyl)-benzyl-6-mercapto-1,3,5-triazine, 2-thio-(4-methacroylmethylene)-benzyl-5-mercapto-1,3,4-thiadiazole, and 3-thio-(4-ethenyl)-benzyl-5-mercapto-1,2,4-triazole.

The optional A represents sufficient number of counter anions to provide a neutral charge for the cyanine dye molecule, when needed. Thus, when the cyanine dye of Structure (I) has one or more cationic groups, and has one or more anionic groups as part of any of $R^1$ through $R^{11}$, the number of A counter anions is reduced by the number of those anionic groups. A can be absent if sufficient anionic groups exist in the $R^1$ through $R^{11}$ groups to counter balance the cationic groups in the molecule. Alternatively, any of the $R^1$ through $R^{11}$ groups can comprise anionic groups and A represents sufficient cations to provide a neutral charge in the molecule. In many embodiments, A is a counter anion that is derived from a strong acid, and includes such anions as $Cl_4^-$, $BF_4^-$, $CF_3SO_3^-$, $PF_6^-$, $AsF_6^-$, $SbF_6^-$, and perfluoroethylcyclohexylsulfonate. Particularly useful counter anions include organic boron-containing anions as described above (tetraaryl borates), methylbenzenesulfonic acid, benzenesulfonic acid, methanesulfonic acid, p-hydroxybenzenesulfonic acid, p-chlorobenzenesulfonic acid, tosylate, and halides. Particularly useful counter anions are the tetraaryl borate (such as tetraphenyl borate) anions as described above.

Other useful A cations are sodium, potassium, lithium, ammonium, or substituted ammonium ions, such as one containing one to sixteen carbon atoms, for example, methyl ammonium, dimethyl ammonium, trimethyl ammonium, tetramethyl ammonium, ethyl ammonium, diethyl ammonium, trimethyl ammonium, tetraethyl ammonium, methyldiethyl ammonium, dimethylethyl ammonium, 2-hydroxyethyl ammonium, di-(2-hydroxyethyl)ammonium, tri-(2-hydroxyethyl)ammonium, 2-hydroxyethyl-dimethyl ammonium, n-propyl ammonium, di-(n-propyl)ammonium, tri-(n-propyl)ammonium, tetra-(n-butyl)ammonium, tetra-(iso-butyl) ammonium, tetra-(sec-butyl)ammonium, and tetra(tert-butyl)ammonium cations.

Representative useful infrared radiation absorbing dyes include the following compounds, which can be used singly or in combinations of two or more compounds:

SENSI 2

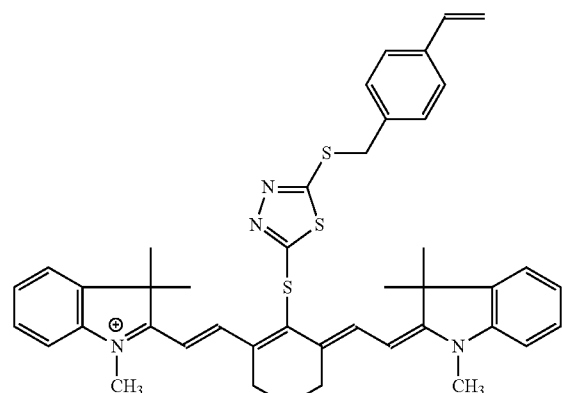

SENSI 3

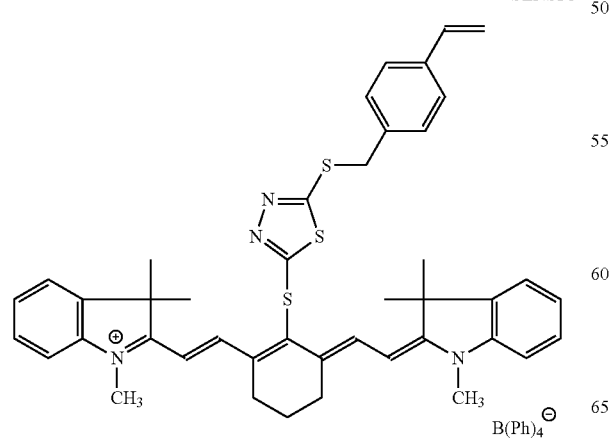

SENSI 4

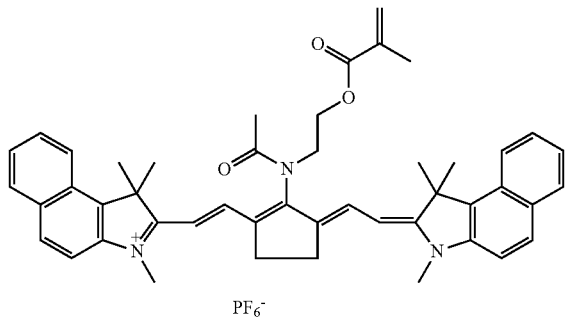

SENSI 5

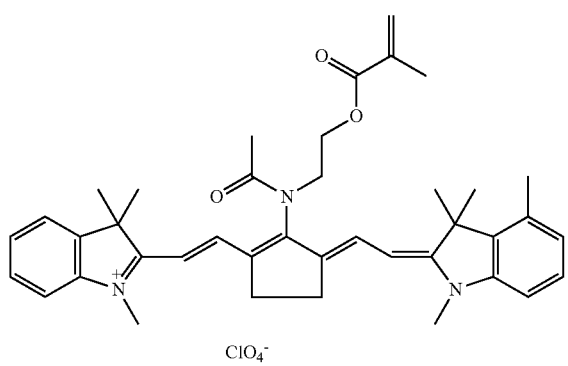

SENSI 9

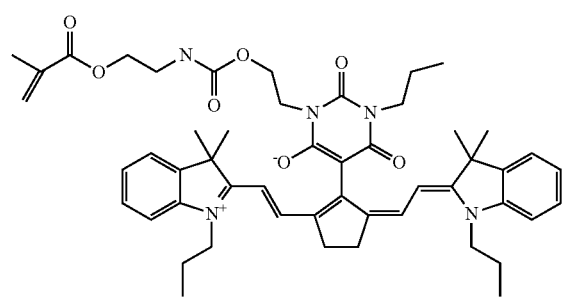

SENSI 10

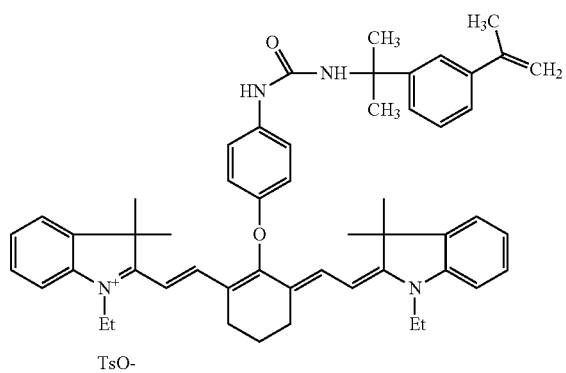

-continued

SENSI 12

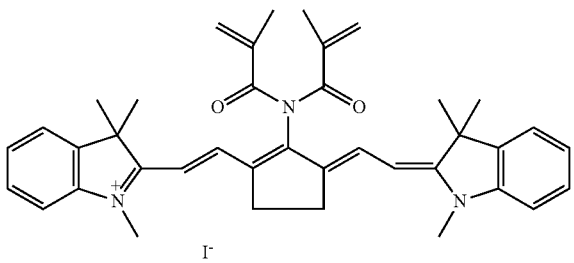

SENSI 13

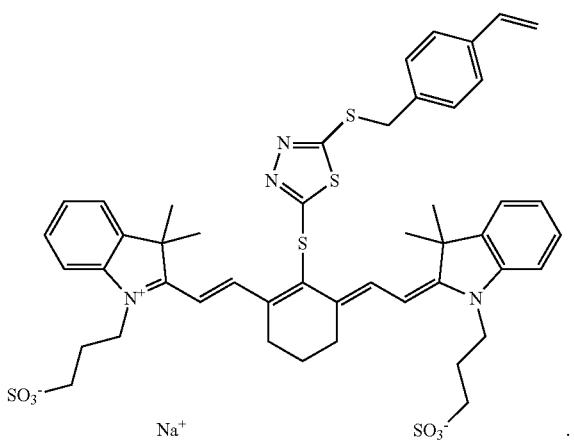

The one or more infrared radiation absorbing dyes are generally present in the imageable layer in an amount of at least 0.1 weight % and up to and including 30 weight %, or at least 2.5 weight % and up to and including 15 weight %, all based on the total solids of the imageable layer.

In some particularly useful lithographic printing plate precursors, the imageable layer comprising an infrared radiation absorbing dye that comprises a cyanine cation and a tetraaryl borate anion, an initiator composition that comprises an iodonium compound comprising a diaryliodonium cation and a tetraphenyl borate anion, and a polymeric binder that comprises a hydrophobic backbone and side chains comprising alkylene oxide segments, or the polymeric binder comprises a hydrophobic backbone and side chains comprising ethylenically unsaturated polymerizable groups. Such polymeric binders can optionally include cyano side groups.

The imageable layer can also include a poly(alkylene glycol) or an ether or ester thereof that has a molecular weight of at least 200 and up to and including 4000. Useful compounds of this type include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. These compounds can be present in an amount of up to 10 weight %, based on the total solids of the imageable layer.

The imageable layer can also include a poly(vinyl alcohol), poly(vinyl pyrrolidone), poly(vinyl imidazole), or polyester in an amount of up to and including 20 weight % based on the total dry weight of the imageable layer.

Additional optional additives in the imageable layer include color developers or acidic compounds such as monomeric phenolic compounds, organic acids or metal salts thereof, oxybenzoic acid esters, acid clays, and other compounds described for example in U.S. Patent Application Publication 2005/0170282 (Info et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts.

The radiation-sensitive composition and imageable layer can also contain a phosphate (meth)acrylate having a molecular weight generally greater than 250 as described in U.S. Pat. No. 7,429,445 (Munnelly et al.) that is incorporated herein by reference. The term "phosphate (meth)acrylate" also includes "phosphate methacrylates" and other derivatives having substituents on the vinyl group in the acrylate moiety.

In some embodiments of this invention, lithographic printing plate precursor comprises a substrate and an imageable layer disposed over the substrate, the imageable layer comprising:
a free radically polymerizable component,
an initiator composition capable of generating free radicals upon exposure to imaging infrared radiation,
an infrared radiation absorbing dye, and
a polymeric binder,
wherein the infrared radiation absorbing dye is a cyanine dye that is represented by the following Structure (I):

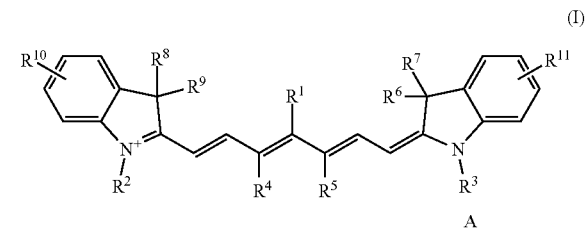

wherein:
$R^1$ is L-$R^x$ wherein L is a single connecting bond or a sulfur or nitrogen atom and $R^x$ is an organic group that comprises a carbon atom connected to L or directly to the illustrated methine chain when L is a single connecting bond, and $R^x$ also comprises one or more ethylenically unsaturated polymerizable groups, provided that when L is a nitrogen atom, L-$R^x$ represents $N(R^a)(R^b)$ wherein $R^a$ and $R^b$ are the same or different groups as defined for $R^x$, or L is a single connecting bond and $R^x$ is a group represented by the following Structure (II) wherein Y is oxygen or sulfur, $R^y$ and $R^z$ are the same or different groups as defined for $R^x$,

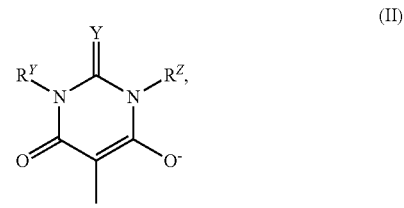

$R^2$ and $R^3$ each independently represent an organic group having 1 to 12 carbon atoms,
$R^4$ and $R^5$ either both represent hydrogen atoms or, together with the carbon atoms to which they are bonded, comprise carbon atoms to form a five- or six-member carbocyclic ring, $R^6$ to $R^9$ each independently represents hydrogen, or an alkyl group or aryl group, and $R^{10}$ and $R^{11}$ independently represent hydrogen or halogen atoms, or alkyl, alkoxy, —COOR, —OR, —SR, or —NR$_2$, groups, or $R^{10}$ and $R^{11}$ independently represent sufficient carbon atoms to form a fused aromatic ring, and A represents one or more optional counter ions sufficient to provide a neutral charge for the cyanine dye, wherein the infrared radiation absorbing dye is present in the imageable layer in an amount of at least 0.1 weight % and up to and including 30 weight %, based on total imageable layer solids, the initiator composition comprises an iodonium compound comprising a diaryliodonium cation and an organic boron-containing anion, and the polymeric binder comprises a hydrophobic backbone and side chains comprising alkylene oxide segments, or the polymeric binder comprises a hydrophobic backbone and side chains comprising ethylenically unsaturated polymerizable groups, and optionally cyano side groups.

In the method of this invention, for providing a lithographic printing plate comprising:

the lithographic printing plate precursor described above is imagewise exposed to infrared radiation to provide exposed and non-exposed regions in the imageable layer in an imaged precursor, and the imaged precursor is processed to remove the non-exposed regions, In useful embodiments of this invention, the lithographic printing plate precursor has an infrared radiation absorbing dye represented by the following Structure (I):

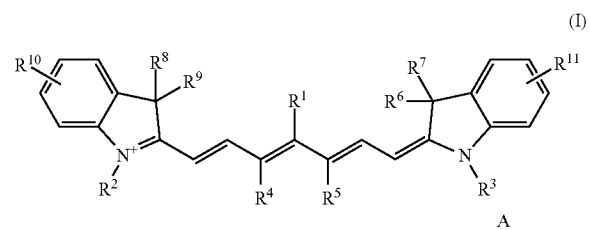

wherein $R^1$ is L-$R^x$ wherein L is a single connecting bond and $R^x$ is a mercapto-functionalized thiazole or thiadiazole group. $R^2$ and $R^3$ each independently represent substituted or unsubstituted organic groups having 1 to 12 carbon atoms (including substituted or unsubstituted alkyl, cycloalkyl, and alkoxy groups), such as alkoxy groups, N-alkyl carboxy groups, and N-alkyl sulfate groups. $R^4$ and $R^5$ either both represent hydrogen atoms or, together with the carbon atoms to which they are bonded, provide carbon atoms to form a five- or six-member carbocyclic ring. Further, $R^6$, $R^7$, $R^8$, and $R^9$ each independently represent hydrogen, a substituted or unsubstituted alkyl having 1 to 12 carbon atoms, or substituted or unsubstituted aryl groups (such as phenyl or naphthyl groups). $R^{10}$ and $R^{11}$ independently represent hydrogen or halogen atoms, or substituted or unsubstituted alkyl groups having 1 to 12 carbon atoms, substituted or unsubstituted alkoxy groups having 1 to 12 carbon atoms, —COOR, —OR, —SR, or —NR$_2$ groups wherein R is hydrogen or an alkyl group. In addition, $R^{10}$ and $R^{11}$ can represent sufficient carbon atoms to form a fused aromatic ring.

A represents, if necessary, one or more counter ions sufficient to provide a neutral charge for the cyanine dye.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). For example, the radiation-sensitive composition can be applied and dried to form an imageable layer.

Illustrative of such manufacturing methods comprises mixing the various components needed for a specific imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Invention Examples below. After proper drying, the coating weight of the imageable layer is generally at least 0.1 g/m$^2$ and up to and including 5 g/m$^2$ or at least 0.5 g/m$^2$ and up to and including 3.5 g/m$^2$.

Layers can also be present under the imageable layer to enhance developability or to act as a thermal insulating layer.

In some embodiments, the imageable layer is the outermost layer in the lithographic printing plate precursor. However, in other embodiments, the lithographic printing plate precursors include a water-soluble or water-dispersible protective outermost overcoat (also sometimes known as an "oxygen impermeable topcoat" or "oxygen barrier layer") disposed over the imageable layer. Such overcoats include various water-soluble polymers such as a poly(vinyl alcohol) that can be hydrolyzed to a desired degree (for example up to and including 85%), poly(vinyl pyrrolidone), poly(ethyleneimine), poly (vinyl imidazoles), and mixtures thereof, and one or more wetting agents, surfactants, colorants, particles, or thickeners. Details about such overcoats are provided for example in WO 2008/150441 (noted above). The dry overcoat coating weight is generally at least 0.1 g/m$^2$ and up to and including 4 g/m$^2$, or typically at least 1 g/m$^2$ and up to and including 2.5 g/m$^2$.

The overcoat formulation can be disposed over the imageable layer by applying it in a suitable solvent or mixture of solvents (such as water and isopropyl alcohol) in any suitable manner and dried.

Once the various layers have been applied and dried on the substrate, the negative-working lithographic printing plate precursors can be enclosed in water-impermeable material that substantially inhibits the transfer of moisture to and from the precursors and "heat conditioned" as described in U.S. Pat. No. 7,175,969 (noted above).

The lithographic printing plate precursors can be stored and transported as stacks of precursors within suitable packaging and containers known in the art.

Imaging Conditions

During use, the lithographic printing plate precursor is exposed to a suitable source of exposing infrared radiation depending upon the specific sensitivity of the imageable layer, that is at a wavelength ($\lambda_{max}$) of at least 700 nm and up to and including 1400 nm, or at least 750 nm and up to and including 1250 nm.

For example, imaging can be carried out using imaging or exposing infrared radiation from an infrared laser (or array of lasers) at a wavelength of at least 750 nm and up to and including about 1400 nm or typically at least 750 nm and up to and including 1250 nm. Imaging can be carried out using imaging infrared radiation at multiple wavelengths at the same time if desired.

The laser used to expose the lithographic printing plate precursor is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.). Imaging with infrared radiation can be carried out generally at imaging energies of at least 30 mJ/cm$^2$ and up to and including 500 mJ/cm$^2$, and typically at least 50 mJ/cm$^2$ and up to and including 300 mJ/cm$^2$ depending upon the sensitivity of the imageable layer.

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

After thermal imaging, the imaged precursors can be processed (developed) "off-press" using an aqueous processing solution that can have a pH of at least 7 and up to and including 14, or typically at least 7 and up to and including 12.5. Processing is carried out for a time sufficient to remove predominantly only the non-exposed regions of the imaged imageable layer of negative-working lithographic printing plate precursors to reveal the hydrophilic surface of the substrate, but not long enough to remove significant amounts of the exposed regions. The revealed hydrophilic surface repels inks while the exposed regions containing polymerized or crosslinked polymer accept ink. Thus, the non-exposed regions to be removed are "soluble" or "removable" in the processing solution because they are removed, dissolved, or dispersed within it more readily than the regions that are to remain. The term "soluble" also means "dispersible".

Development can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a processing solution (described below), and optionally followed by rinsing with water. "Dip" development involves dipping the imaged precursor in a tank or tray containing the appropriate processing solution for at least 10 seconds and up to and including 60 seconds under agitation, optionally followed by rinsing with water with or without rubbing with a sponge or cotton pad. The use of automatic development apparatus is well known and generally includes pumping a processing solution into a developing tank or ejecting it from spray nozzles. The apparatus can also include a suitable rubbing mechanism (for example a brush or roller) and a suitable number of conveyance rollers. Some developing apparatus include laser exposure means and the apparatus is divided into an imaging section and a developing section.

Both aqueous alkaline developers and organic solvent-containing developers or processing solutions can be used. Some useful developer solutions are described for example, in U.S. Pat. No. 7,507,526 (Miller et al.) and U.S. Pat. No. 7,316,894 (Miller et al.) that are incorporated herein by reference. Developer solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). Thus, useful developers or processing solutions useful in the practice of this invention commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). Both aqueous alkaline developers and organic solvent-containing developers can be used. Plain water can also be used, particularly if it is warmed more than room temperature.

Useful alkaline aqueous developers include but are not limited to, 3000 Developer, 9000 Developer, GOLDSTAR Developer, GREENSTAR Developer, ThermalPro Developer, PROTHERM Developer, MX1813 Developer, 1090 Developer, 206 Developer, and MX1710 Developer (all available from Eastman Kodak Company).

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and preferably, they are alkaline in pH.

Representative solvent-containing developers include but are not limited to, ND-1 Developer, Developer 980, Developer 1080, 2 in 1 Developer, 955 Developer, D29 Developer (described below), Kodak® SP200 Developer, and 956 Developer (all available from Eastman Kodak Company). These developers can be diluted with water if desired.

Other useful solvent-containing developers are described in copending and commonly assigned U.S. Ser. No. 12/959,432 (filed on Dec. 3, 2010 by Balbinot, Jarek, Huang, Tao, and Simpson). These developers contain anionic surfactants and organic solvents (such as benzyl alcohol) in an amount of at least 7 weight %. Another useful developer is described in copending and commonly assigned U.S. Ser. No. 12/959,440 (filed on Dec. 3, 2010 by Strehmel, Piestert, and Baumann).

In some instances, an aqueous processing solution can be used to both develop the imaged precursor by removing predominantly the non-exposed regions and also to provide a protective layer or coating over the entire imaged and developed surface. In this aspect, the aqueous alkaline solution behaves somewhat like a gum that is capable of protecting (or "gumming") the lithographic image on the printing plate against contamination or damage (for example, from oxidation, fingerprints, dust, or scratches). The aqueous alkaline solution generally includes an organic amine having a boiling point of less than 300° C. (and typically of at least 50° C.), a film-forming hydrophilic polymer, and optionally an anionic or nonionic surfactant. The pH of the aqueous alkaline solution can be adjusted by adding a suitable amount of a alkaline component such as alkali silicates (including metasilicates), alkali metal hydroxides (such as sodium hydroxide and potassium hydroxide), and quaternary ammonium hydroxides. Tap water can be used to make up the solution and generally provides at least 45 weight % and up to and including 98 weight % of the solution.

Useful organic amines are relatively volatile organic primary, secondary, and tertiary amines that include but are not limited to, alkanolamines (including cycloalkyl amines), carbocyclic aromatic amines, and heterocyclic amines, that are present in a total amount of at least 0.1 weight % and generally up to and including 50 weight %. Useful amines are mono-, di- and trialkanol amines such as monoethanolamine, diethanolamine, triethanolamine, and mono-n-propanolamine, or combinations of these compounds.

One or more film-forming water-soluble or hydrophilic polymers are present in the processing solution in an amount of at least 0.25 weight % and up to 30 weight % and typically at least 1 weight % and up to and including 15 weight %. Examples of useful polymers of this type include but are not limited to, gum arabic, pullulan, cellulose derivatives (such as hydroxymethyl celluloses, carboxymethylcelluloses, carboxyethylcelluloses, and methyl celluloses), starch derivatives [such as (cyclo)dextrins, starch esters, dextrins, carboxymethyl starch, and acetylated starch] poly(vinyl alcohol), poly(vinyl pyrrolidone), polyhydroxy compounds [such as polysaccharides, sugar alcohols such as sorbitol, miso-inosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulfo, or phospho groups, or salts thereof. Useful hydrophilic polymers include gum arabic, (cyclo)dextrin, a polysaccharide, a sugar alcohol, or a homo- or copolymer having recurring units derived from (meth)acrylic acid.

The processing solution optionally includes one or more anionic, amphoteric, or nonionic surfactants (or both) in an amount of at least 0.25 weight % and up to and including 50 weight %, and typically at least 0.25 weight % and up to and including 30 weight %.

Additional optional components of the processing solutions useful in the practice of this invention include antifoaming agents, buffers, biocides, complexing agents, and small amounts of water-miscible organic solvents such as reaction products of phenol with ethylene oxide and propylene oxide, benzyl alcohol, esters of ethylene glycol and propylene glycol with acids having 6 or less carbon atoms, sludge inhibitors (such as filter dyes and free-radical inhibitors), odorants, anti-corrosion agents, and dyes.

Following processing, the resulting lithographic printing plate can be used for printing with or without a separate rinsing step using water. In most instances, the lithographic printing plates are used for printing after development without further contact with any additional solutions such as rinsing or gumming solutions.

The resulting lithographic printing plate can also be baked in a postbake operation that can be carried out, with or without a blanket or floodwise exposure to UV or visible radiation using known conditions. Alternatively, a blanket UV or visible radiation exposure can be carried out, without a postbake operation.

Printing can be carried out by applying a lithographic printing ink and fountain solution to the printing surface of the imaged and developed precursor. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material.

With or without a post-exposure baking step after imaging and before development, some imaged lithographic printing plate precursors provided by this invention can be developed "on-press". In most embodiments, a post-exposure baking step is omitted before on-press development. The imaged precursor is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is yarn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged precursor to the receiving material. The imaged precursors can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A lithographic printing plate precursor comprising a substrate and an imageable layer disposed over the substrate, the imageable layer comprising:
   a free radically polymerizable component,
   an initiator composition capable of generating free radicals upon exposure to imaging infrared radiation,
   an infrared radiation absorbing dye, and
   a polymeric binder,
   wherein the infrared radiation absorbing dye is a cyanine dye that is represented by the following Structure (I):

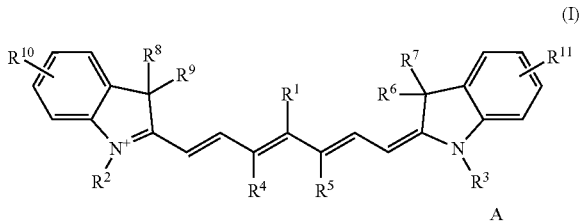

(I)

wherein:

$R^1$ is L-$R^x$ wherein L is a single connecting bond or a sulfur or nitrogen atom and $R^x$ is an organic group that comprises a carbon atom connected to L or directly to the illustrated methine chain when L is a single connecting bond, and $R^x$ also comprises one or more ethylenically unsaturated polymerizable groups, provided that when L is a nitrogen atom, L-$R^x$ represents N($R^a$)($R^b$) wherein $R^a$ and $R^b$ are the same or different groups as defined for $R^x$, $R^2$ and $R^3$ each independently represent an organic group having 1 to 12 carbon atoms, $R^4$ and $R^5$ either both represent hydrogen atoms or, together with the carbon atoms to which they are bonded, comprise carbon atoms to form a five- or six-member carbocyclic ring, $R^6$ to $R^9$ each independently represents hydrogen, or an alkyl group or aryl group, and $R^{10}$ and $R^{11}$ independently represent hydrogen or halogen atoms, or alkyl, alkoxy, —COOR, —OR, —SR, or —NR$_2$ groups, or $R^{10}$ and $R^{11}$ independently represent sufficient carbon atoms to form a fused aromatic ring, and A represents one or more optional counter ions sufficient to provide a neutral charge for the cyanine dye.

2. The lithographic printing plate precursor of embodiment 1 wherein L is a sulfur or nitrogen linking atom, and $R^x$ represents a carbocyclic or heterocyclic aromatic group, a heterocyclic non-aromatic group, or an alkyl group having 1 to 12 carbon atoms, which carbocyclic or heterocyclic aromatic, heterocyclic non-aromatic, or alkyl group comprises one or more ethylenically unsaturated polymerizable groups.

3. The lithographic printing plate precursor of embodiment 1 or 2 wherein L is a single connecting bond, and $R^x$ is a group represented by the following Structure (II) wherein Y is oxygen or sulfur, and $R^y$ and $R^z$ are the same or different organic groups as described for $R^x$, at least one of which comprises one or more ethylenically unsaturated polymerizable groups:

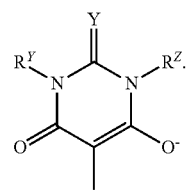

(II)

4. The lithographic printing plate precursor of any of embodiments 1 to 3 wherein $R^x$ comprises a mercapto-functionalized thiazole or thiadiazole group and one or more ethylenically unsaturated polymerizable groups attached to the mercapto-functionalized thiazole or thiadiazole group.

5. The lithographic printing plate precursor of any of embodiments 1 to 4 wherein A is a tetraaryl borate anion.

6. The lithographic printing plate precursor of any of embodiments 1 to 5 wherein the infrared radiation absorbing dye is present in the imageable layer in an amount of at least 0.1 weight % and up to and including 30 weight %, based on total imageable layer solids.

7. The lithographic printing plate precursor of any of embodiments 1 to 6 wherein the initiator composition comprises an onium compound selected from the group consisting of diaryliodonium tetraaryl borates, triarylsulfonium tetraaryl borates, and alkoxy- or aryloxypyridinium tetraaryl borates.

8. The lithographic printing plate precursor of any of embodiments 1 to 7 wherein the initiator composition comprises an iodonium compound comprising a diaryliodonium cation and an organic boron-containing anion.

9. The lithographic printing plate precursor of any of embodiments 1 to 8 wherein the imageable layer is the outermost layer of the precursor.

10. The lithographic printing plate precursor of any of embodiments 1 to 8 further comprising a protective outermost overcoat disposed over the imageable layer.

11. The lithographic printing plate precursor of any of embodiments 1 to 10 wherein the initiator composition is present in an amount of at least 1 weight % based on imageable layer total solids.

12. The lithographic printing plate precursor of any of embodiments 1 to 11 that is on-press developable.

13. The lithographic printing plate precursor of any of embodiments 1 to 12 wherein the polymeric binder comprises a hydrophobic backbone and side chains comprising alkylene oxide segments, and optionally cyano side groups.

14. The lithographic printing plate precursor of any of embodiments 1 to 13 wherein the polymeric binder comprises a hydrophobic backbone and side chains comprising ethylenically unsaturated polymerizable groups, and optionally cyano side groups.

15. A method for providing a lithographic printing plate comprising:

imagewise exposing the lithographic printing plate precursor of any of embodiments 1 to 14 to infrared radiation to provide exposed and non-exposed regions in the imageable layer in an imaged precursor, and processing the imaged precursor to remove the non-exposed regions.

16. The method of embodiment 15 comprising processing the imaged precursor off-press using a processing solution.

17. The method of embodiment 15 comprising processing the imaged precursor on-press using a lithographic printing ink, a fountain solution, or both a lithographic printing ink and a fountain ink.

19. The method of any of embodiments 15 to 18 comprising imagewise exposing the lithographic printing plate precursor using radiation having a $\lambda_{max}$ of at least 700 nm and up to and including 1400 nm.

The following Examples are provided to illustrate the practice of this invention and are not meant to be limiting in any manner. The components and materials used in the examples were as follows:

BLO represents γ-butyrolactone.

Byk® 307 is a polyethoxylated dimethyl polysiloxane that is available from Byk Chemie.

CD9053 is an adhesion promoter that is available from Sartomer.

Developing Solution A contained 7.14 g of phenoxy ethanol, 1.71 g of diethanolamine, 7.14 g of Emulan® TO40 nonionic surfactant, 4.76 g of Sorbidex 200, 5 g of urea, 1 g of Naxan® ABL, and 67.15 g of water.

Hybridur® 580 is a urethane-acrylic hybrid polymer dispersion that is available from Air Products and Chemicals.

Dowanol® PM is propylene glycol methyl ether that is available from Dow Chemical.

EDTA represents ethylene diaminetetraacetic acid.

Emulan® TO40 is a nonionic surfactant that is available from BASF.

Ethylan HB4 is a nonionic surfactant that is available from Akzo Nobel.

IB05 represents bis(4-t-butylphenyl)-iodonium tetraphenylborate.

Klucel E is a nonionic cellulose ether that is available from Ashland Industries.

Lutensol® TO10 is an ethoxylated C13 alcohol that is available from BASF.

MEK represents methyl ethyl ketone.

Naxan® ABL is an anionic surfactant that is available from Nease Co.

Pig951 is a dispersion in propylene glycol monomethyl ether containing 9 weight % of copper phthalocyanine and 1 weight % of a poly(vinyl acetal) binder containing 39.9 mol % of vinyl alcohol recurring units, 1.2 mol % of vinyl acetate recurring units, 15.4 mol % of acetal groups from acetaldehyde, 36.1 mol % of acetal groups from butyraldehyde, and 7.4 acetal groups from 4-formylbenzoic acid.

Polymer 1 is a copolymer prepared by random polymerization of the monomers methacrylic acid, allyl methacrylic acid ester, benzyl methacrylic acid ester, and isopropyl acrylamide at a 20/40/20/20 molar ratio and had an acid number of 87.

Polymer 2 is an emulsion copolymer formed from poly (ethylene) glycol methyl ether methacrylate (PEGMA), acrylonitrile, and styrene monomers at 10/60/20 weight ratio in 80:20 n-propanol water. The synthesis of these copolymers was performed as described for polymer A described in U.S. Pat. No. 7,592,128 (Huang et al.).

Polymer 3 is a copolymer formed by random polymerization of benzyl methacrylic acid ester, N-vinyl carbazole, acrylonitrile, and methacrylic acid at a 28/20/40/12 molar ratio.

PVA403 is a poly(vinyl alcohol) that is available from Kuraray.

SD1000 is a carboxylic acid modified poly(vinyl alcohol) that was obtained from Kuraray.

SENSI 1 is a cyanine chloride dye that has the following structure:

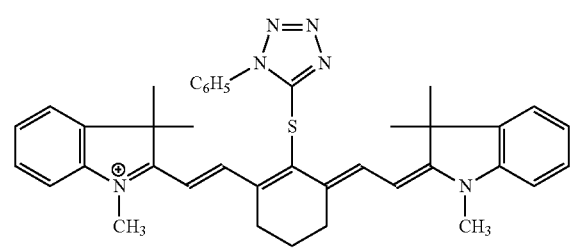

SENSI 2 is a cyanine chloride dye that is has the following structure:

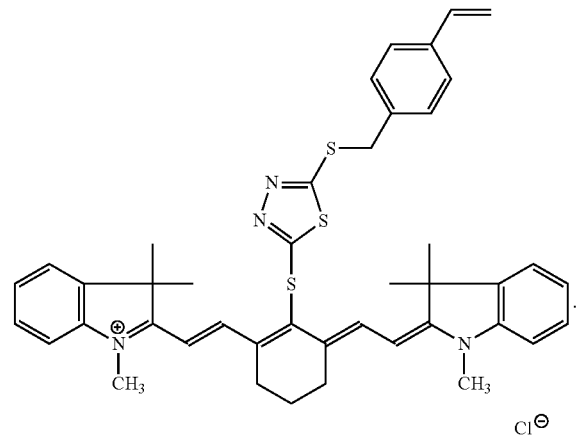 [SMILES: C=Cc1ccc(CSc2nnc(SC3=C(/C=C/C4=[N+](C)c5ccccc5C4(C)C)CCC/C3=C\C=C3\N(C)c4ccccc4C3(C)C)s2)cc1 ; [Cl-]]

SENSI 3 is a cyanine tetraphenyl borate dye that has the following structure:

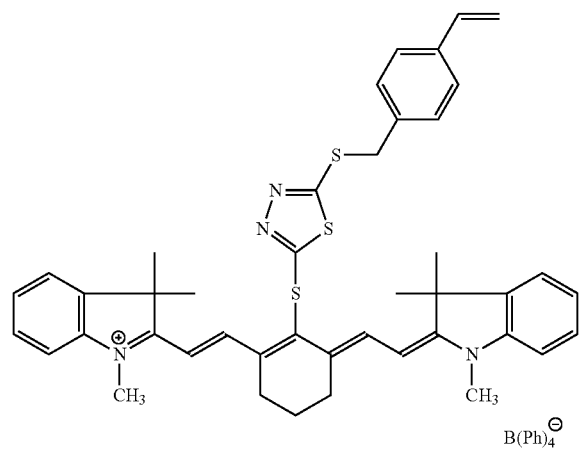 [SMILES: C=Cc1ccc(CSc2nnc(SC3=C(/C=C/C4=[N+](C)c5ccccc5C4(C)C)CCC/C3=C\C=C3\N(C)c4ccccc4C3(C)C)s2)cc1 ; "B(Ph)4"]

SENSI 4 is a cyanine dye that has the following structure:

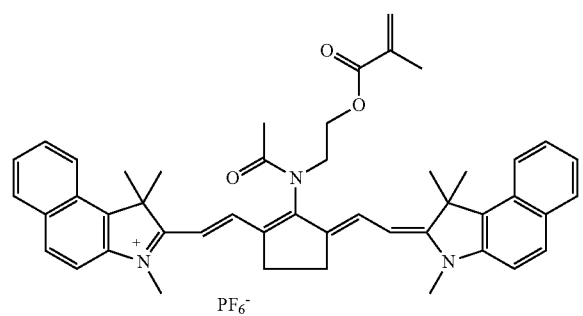

SENSI 5 is a cyanine dye that has the following structure:

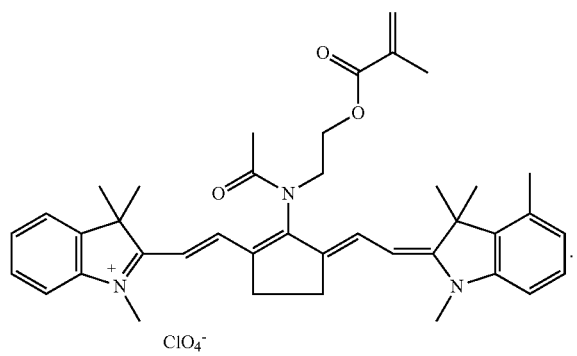

SENSI 6 is a cyanine tetraphenyl borate dye that has the following structure:

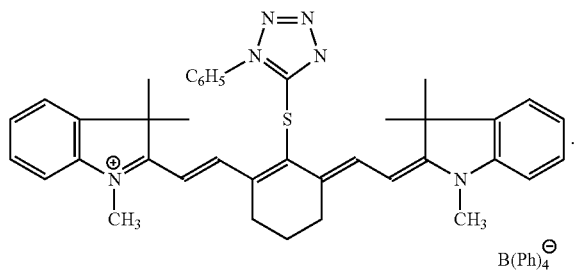

SENSI 7 is a cyanine tetraphenyl borate dye that has the following structure:

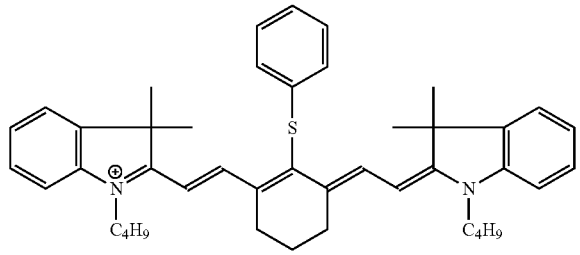

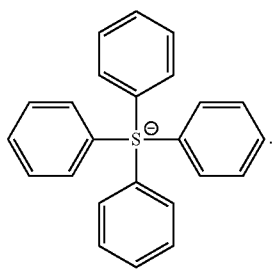

SENSI 8 is a cyanine tetraphenyl borate dye that has the following structure:

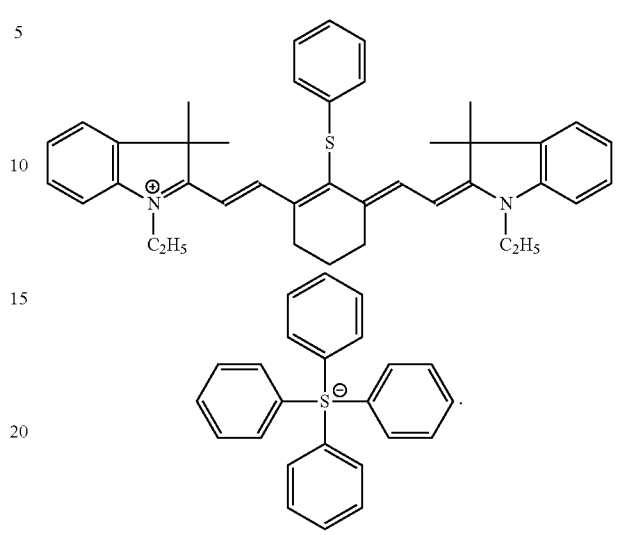

SENSI 9 is a cyanine dye that has the following structure:

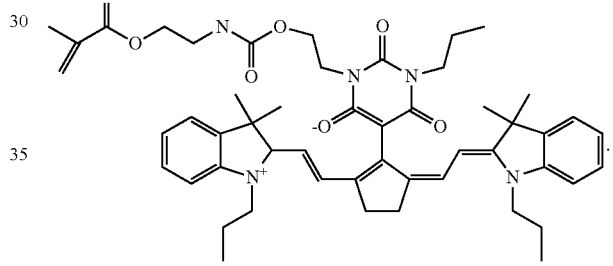

SENSI 11 is a cyanine tetraphenyl borate dye that has the following structure:

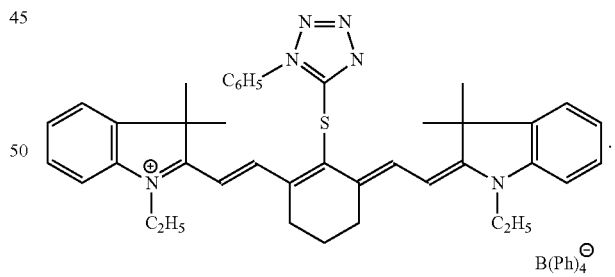

Sorbidex 200 is a saccharide syrup that is available from Cerestar.

Kodak® SP200 is a developing solution that is available from Eastman Kodak Company.

SR399 is dipentaerythrithol pentaacrylate that is available from Sartomer.

SR602 is ethoxylated bisphenol A diacrylate that is available from Sartomer.

Surfynol® 440 is a nonionic surfactant that is available from Air Products and Chemicals.

Lithographic Printing Plate Precursor 1:

An imageable layer formulation was prepared by dissolving or dispersing 0.73 g of Hybridur® 580, 0.44 g of Polymer 1, 2.94 g of SR399, 0.12 g of CD9053, 1.68 g of Pig951, 0.22 g of IB05, 0.06 g of IR dye (see TABLE I below), and 0.12 g of Byk® 307 in a mixture of 2.03 g of BLO, 7.89 g of MEK, 7.20 g of Dowanol® PM, and 0.25 g of water.

This imageable layer formulation was applied to an electrochemically grained and anodized aluminium substrate that had been post-treated with poly(vinyl phosphoric acid) to provide a dry imageable layer coating weight of about 1.2 g/m². On the dried imageable layer, a topcoat layer was applied from a formulation comprising 0.978 g of PVA403, 0.2 g of Lutensol® TO10, 0.02 g of Surfynol® 440, and 50 g of water to provide a dry coating weight of 0.5 g/m².

The resulting negative-working lithographic printing plate precursors were treated with a rubber wheel (1.5 cm in diameter and 0.3 cm thick) to simulate roller pressure and initiate crystal formation of the IR dye in the imageable layer. The rubber wheel was moved over each precursor with 15 kg$_f$ contact pressure and subsequently subjected to a vapor chamber test in Dowanol® PM. After 24 hours, each lithographic printing plate precursor was visually inspected for crystal formation of IR dye.

Further, a sample of each lithographic printing plate precursor was subjected to an accelerated aging test in a climate chamber for 10 days at 40° C. and 80% RH. These precursors were subsequently imaged using a Kodak®Trendsetter 800 II Quantum platesetter (830 nm) at 80 mJ/cm². They were then developed in commercial SP200 developer and inspected for speed loss. The results are shown below in TABLE I.

TABLE I

|  | SENSI IR dye | Blooming[a] | Speed, Fresh | Speed, Aged |
|---|---|---|---|---|
| Invention Example 1 | 2 | A | 7 | 6-7 |
| Invention Example 2 | 3 | A | 7 | 6-7 |
| Invention Example 3 | 4 | A | 6 | 5 |
| Invention Example 4 | 5 | A | 6 | 5 |
| Invention Example 5 | 9 | A | 6 | 5 |
| Comparative Example 1 | 1 | E | 6-7 | 2-3 |
| Comparative Example 2 | 6 | E | 6-7 | 2-3 |
| Comparative Example 3 | 7 | E | 7 | 2-3 |
| Comparative Example 4 | 8 | C | 6 | 4 |
| Comparative Example 5 | 11 | E | 6 | 2-3 |

[a]Blooming is a rating of the amount of the crystals seen after the vapor chamber test with A representing the result of no crystals observed, E representing the result of many crystals observed, and C representing the result of some crystals observed.
"b" The number of grayscale steps of the imageable layer remaining after development in an area where a UGRA® grayscale wedge was glued on top of the precursor during IR imaging. Grayscale steps were measured after 200 sheet impressions.

Lithographic Printing Plate Precursor 2:

An imageable layer formulation was prepared by dissolving or dispersing 1.34 g of Hybridur® 580, 0.44 g of Polymer 3, 2.94 g of SR399, 0.12 g of CD9053, 1.68 g of Pig951, 0.22 g of IB05, 0.06 g of IR dye (see TABLE II below), and 0.12 g of Byk® 307 in a mixture of 2.03 g of BLO, 7.89 g of MEK, 7.20 g of Dowanol® PM (2-methoxy propanol), and 0.25 g of water.

For each precursor, this imageable layer formulation was applied to an electrochemically grained and anodized aluminium substrate that had been post-treated with poly(vinyl phosphoric acid) to provide a dry coating imageable layer weight of about 1.2 g/m². On the dried imageable layer, a topcoat layer was applied from a formulation comprising 0.978 g of PVA403, 0.2 g of Lutensol® TO10, 0.02 g of Surfynol® 440, and 50 g of water to provide a dry coating weight of 0.5 g/m².

The resulting negative-working lithographic printing plate precursors were treated with a rubber wheel (1.5 cm in diameter and 0.3 cm thick) to simulate roller pressure and initiate crystal formation of the IR dye in the imageable layer. The rubber wheel was moved over the outermost topcoat surface with 15 kg$_f$ contact pressure and subsequently subjected to a vapor chamber test in Dowanol® PM (2-methoxy propanol). After 24 hours, the lithographic printing plate precursors were visually inspected for crystal formation of the IR dye.

Further, samples of each lithographic printing plate precursor were subjected to an accelerated aging test in a climate chamber for 10 days at 40° C. and 80% RH. Both "fresh" (non-aged) and aged precursor samples were then imaged under a silver halftone film (UGRA® grayscale) using a Kodak® Trendsetter 800 II Quantum platesetter (830 nm) at 80 mJ/cm², developed in Kodak® SP200 developer, and inspected for speed loss. The results are shown below in TABLE II.

TABLE II

|  | SENSI IR Dye | Blooming[a] | Speed[b], Fresh | Speed[b], Aged |
|---|---|---|---|---|
| Example 6 | 2 | A | 7 | 5 |
| Comparative Example 6 | 1 | E | 7 | 3 |

[a]Blooming is a rating of the amount of the crystals seen after the vapor chamber test with A representing the result of no crystals observed, E representing the result of many crystals observed, and C representing the result of some crystals observed.
[b]The number of grayscale steps of the imageable layer remaining after development in an area where a UGRA® grayscale wedge was glued on top of the precursor during IR imaging.

Lithographic Printing Plate Precursor 3:

An imageable layer formulation was prepared by combining 1.3 g of SR399, 1.3 g of SR602, 2.87 g of Polymer 2, 0.09 g of IR dye (see TABLE III), 2.25 g of Klucel E, 0.06 g of mercaptotriazole, and 0.23 g of IB05 in a mixture of 0.6 g Dowanol® PM, 2.7 g MEK, 1.3 g water, and 5.2 g of n-propanol. The formulation was coated onto an electrochemically grained and phosphoric acid anodized aluminium substrate that had been post-treated with poly(acrylic acid) to provide a dry coating weight of about 0.9 g/m².

The resulting lithographic printing plate precursors were placed on a Kodak® Trendsetter 800 II Quantum platesetter (830 nm) using a gray scale wedge with defined tonal values for evaluating the quality of the copies and exposed at 200 mJ/cm² using an 830 nm IR laser. Samples of each lithographic printing plate precursor were subjected to an accelerated aging test in a climate chamber for 10 days at 40° C. and 80% RH. After imaging, the precursors were mounted onto a printing press, and without off-press processing, and they were pre-dampened using Sun Chemical S7184/CF01 lithographic printing ink available from Sun Chemical Inc. and Böttcher Fount S-3021 fountain solution available from Böttcher GmbH.

TABLE III

| | SENSI IR Dye | Speed[a], Fresh | Speed[a], Aged | Clean Up | Scumming on Press | Runlength, Fresh | Runlength, Aged |
|---|---|---|---|---|---|---|---|
| Example 7 | 3 | 5-6 | 4-5 | <20 | No | 45000 | 40000 |
| Comparative Example 7 | 7 | 6 | 1-2 | >100 | Yes | 45000 | 10000 |

[a]The number of grayscale steps of the imageable layer remaining after development in an area where a UGRA ® grayscale wedge was glued on top of the precursor during IR imaging. Grayscale steps were measured on paper after 200 impressions.

These results show that on-press developability of "aged" lithographic printing plate precursors is acceptable and scumming was not observed during their development.

Lithographic Printing Plate Precursor 4:

An imageable layer formulation was prepared by dissolving or dispersing 1.34 g of Hybridur® 580, 0.44 g of Polymer 1, 2.94 g of SR399, 0.12 g of CD9053, 1.68 g of Pig951, 0.22 g of IB05, 0.06 g of IR dye (see Invention Example 8 and Comparative Example 8 in TABLE IV below), and 0.12 g of Byk® 307 in a mixture of 2.03 g of BLO, 7.89 g of MEK, 7.20 g of Dowanol® PM (2-methoxy propanol), and 0.25 g of water.

For each precursor, this imageable layer formulation was applied to an electrochemically grained and anodized aluminium substrate that had been post-treated with poly(vinyl phosphoric acid) to provide a dry coating imageable layer weight of about 0.9 g/m². On the dried imageable layer, a topcoat layer was applied from a formulation comprising 0.978 g of SD1000, 0.2 g of Lutensol® TO10, 0.02 g of Surfynol® 440, and 50 g of water to provide a dry coating weight of 0.2 g/m².

The resulting negative-working lithographic printing plate precursors were treated with a rubber wheel (1.5 cm in diameter and 0.3 cm thick) to simulate roller pressure and initiate crystal formation of the IR dye in the imageable layer. The rubber wheel was moved over the outermost topcoat surface with 15 kg$_f$ contact pressure and subsequently subjected to a vapor chamber test in Dowanol® PM (2-methoxy propanol). After 24 hours, the lithographic printing plate precursors were visually inspected for crystal formation of the IR dye.

Further, samples of each lithographic printing plate precursor were subjected to an accelerated aging test in a climate chamber for 10 days at 40° C. and 80% RH. Both "fresh" (non-aged) and aged precursor samples were then imaged under a silver halftone film (UGRA® gray scale) using a Kodak® Trendsetter 800 II Quantum platesetter (830 nm) at 95 mJ/cm², developed in developing solution A, and inspected for speed loss. The results are shown below in TABLE IV.

Lithographic Printing Plate Precursor 5:

An imageable layer formulation was prepared by dissolving or dispersing 1.34 g of Hybridur® 580, 0.44 g of Polymer 1, 2.94 g of SR399, 0.12 g of CD9053, 1.68 g of Pig951, 0.22 g of IB05, 0.06 g of IR dye (see Invention Example 9 and Comparative Example 9 in TABLE IV below), and 0.12 g of Byk® 307 in a mixture of 2.03 g of BLO, 7.89 g of MEK, 7.20 g of Dowanol® PM (2-methoxy propanol), and 0.25 g of water.

For each precursor, this imageable layer formulation was applied to an electrochemically grained and anodized aluminium substrate that had been post-treated with poly(vinyl phosphoric acid) to provide a dry coating imageable layer weight of about 0.9 g/m².

The resulting negative-working lithographic printing plate precursors were treated with a rubber wheel (1.5 cm in diameter and 0.3 cm thick) to simulate roller pressure and initiate crystal formation of the IR dye in the imageable layer. The rubber wheel was moved over the outermost surface with 15 kg$_f$ contact pressure and subsequently subjected to a vapor chamber test in Dowanol® PM (2-methoxy propanol). After 24 hours, the lithographic printing plate precursors were visually inspected for crystal formation of the IR dye.

Further, samples of each lithographic printing plate precursor were subjected to an accelerated aging test in a climate chamber for 10 days at 40° C. and 80% RH. Both "fresh" (non-aged) and aged precursor samples were then imaged under a silver halftone film (UGRA® gray scale) using a Kodak® Trendsetter 800 II Quantum platesetter (830 nm) at 110 mJ/cm², developed in developing solution A, and inspected for speed loss. The results are shown below in TABLE IV.

TABLE IV

| | SENSI IR Dye | Blooming[a] | Speed[b], Fresh | Speed[b], Aged |
|---|---|---|---|---|
| Invention Example 8 | 2 | A | 6 | 5-6 |
| Invention Example 9 | 2 | A | 7 | 6 |
| Comparative Example 8 | 1 | E | 6 | 3-4 |
| Comparative Example 9 | 1 | E | 6 | 3-4 |

[a]Blooming is a rating of the amount of the crystals seen after the vapor chamber test with A representing the result of no crystals observed, E representing the result of many crystals observed, and C representing the result of some crystals observed.

[b]The number of grayscale steps of the imageable layer remaining after development in an area where a UGRA ® grayscale wedge was glued on top of the precursor during IR imaging.

The invention has been described in detail with particular reference to certain preferred embodiments thereof, but it will be understood that variations and modifications can be effected within the spirit and scope of the invention.

The invention claimed is:

1. A lithographic printing plate precursor comprising a substrate and an imageable layer disposed over the substrate, the imageable layer comprising:

a free radically polymerizable component, an initiator composition capable of generating free radicals upon exposure to imaging infrared radiation, an infrared radiation absorbing dye, and a polymeric binder, wherein the infrared radiation absorbing dye is a cyanine dye that is represented by the following Structure (I):

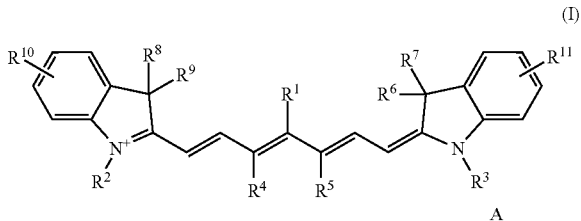

(I)

wherein:
$R^1$ is L-$R^x$ wherein L is a single connecting bond and $R^x$ is represented by the following Structure (II) wherein Y is oxygen or sulfur, and $R^y$ and $R^z$ are the same or different substituted or unsubstituted carbocyclic or heterocyclic aromatic groups, substituted or unsubstituted heterocyclic non-aromatic groups, or substituted or unsubstituted alkyl groups, at least one of $R^y$ and $R^z$ comprising one or more ethylenically unsaturated polymerizable groups,

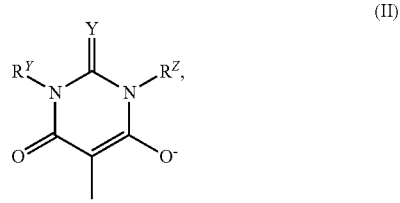

(II)

$R^2$ and $R^3$ each independently represent an organic group having 1 to 12 carbon atoms, $R^4$ and $R^5$ either both represent hydrogen atoms or, together with the carbon atoms to which they are bonded, comprise carbon atoms to form a five- or six-member carbocyclic ring, $R^6$ to $R^9$ each independently represents hydrogen, or an alkyl group or aryl group, and $R^{10}$ and $R^{11}$ independently represent hydrogen or halogen atoms, or alkyl, alkoxy, —COOR, —OR, —SR, or —$NR_2$, groups, or $R^{10}$ and $R^{11}$ independently represent sufficient carbon atoms to form a fused aromatic ring, and A represents one or more optional counter ions sufficient to provide a neutral charge for the cyanine dye.

2. The lithographic printing plate precursor of claim 1, wherein A is an optional tetraaryl borate anion.

3. The lithographic printing plate precursor of claim 1, wherein the infrared radiation absorbing dye is present in the imageable layer in an amount of at least 0.1 weight % and up to and including 30 weight %, based on total imageable layer solids.

4. The lithographic printing plate precursor of claim 1, wherein the initiator composition comprises an onium compound selected from the group consisting of diaryliodonium tetraaryl borates, triarylsulfonium tetraaryl borates, and alkoxy- or aryloxypyridinium tetraaryl borates.

5. The lithographic printing plate precursor of claim 1, wherein the initiator composition comprises an iodonium compound comprising a diaryliodonium cation and an organic boron-containing anion.

6. The lithographic printing plate precursor of claim 1, wherein the imageable layer is the outermost layer.

7. The lithographic printing plate precursor of claim 1 further comprising a protective outermost overcoat disposed over the imageable layer.

8. The lithographic printing plate precursor of claim 1, wherein the initiator composition is present in an amount of at least 1 weight % based on imageable layer total solids.

9. The lithographic printing plate precursor of claim 1 that is on-press developable.

10. The lithographic printing plate precursor of claim 1, wherein the polymeric binder comprises a hydrophobic backbone and side chains comprising alkylene oxide segments, and optionally cyano side groups.

11. The lithographic printing plate precursor of claim 1, wherein the polymeric binder comprises a hydrophobic backbone and side chains comprising ethylenically unsaturated polymerizable groups, and optionally cyano side groups.

12. A method for providing a lithographic printing plate comprising:
imagewise exposing the lithographic printing plate precursor of claim 1 to infrared radiation to provide exposed and non-exposed regions in the imageable layer in an imaged precursor, and
processing the imaged precursor to remove the non-exposed regions.

13. The method of claim 12 comprising processing the imaged precursor off-press using a processing solution.

14. The method of claim 12 comprising processing the imaged precursor on-press using a lithographic printing ink, a fountain solution, or both a lithographic printing ink and a fountain ink.

15. The method of claim 12 comprising imagewise exposing the lithographic printing plate precursor using radiation having $\lambda_{max}$ of at least 700 nm and up to and including 1400 nm.

* * * * *